US011510335B2

United States Patent
Alharbi

(10) Patent No.: US 11,510,335 B2
(45) Date of Patent: Nov. 22, 2022

(54) FLEXIBLE ROTATING BLANKING PANEL FOR AN IT RACK

(71) Applicant: Saudi Arabian Oil Company, Dhahran (SA)

(72) Inventor: Abdullah Saleh Alharbi, Dammam (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 17/195,858

(22) Filed: Mar. 9, 2021

(65) Prior Publication Data
US 2022/0295661 A1    Sep. 15, 2022

(51) Int. Cl.
| | |
|---|---|
| *H05K 7/14* | (2006.01) |
| *H05K 7/18* | (2006.01) |
| *H05K 7/20* | (2006.01) |
| *A47B 47/03* | (2006.01) |
| *A47B 96/20* | (2006.01) |

(52) U.S. Cl.
CPC ......... *H05K 7/1489* (2013.01); *H05K 7/1488* (2013.01); *H05K 7/183* (2013.01); *H05K 7/20736* (2013.01); *A47B 47/03* (2013.01); *A47B 96/20* (2013.01)

(58) Field of Classification Search
CPC .. H05K 7/1489; H05K 7/20736; H05K 7/183; A47B 47/03; A47B 96/20
See application file for complete search history.

(56) References Cited

U.S. PATENT DOCUMENTS

| | | | |
|---|---|---|---|
| 5,424,912 A * | 6/1995 | Mikan | H05K 7/1421 |
| | | | 361/679.02 |
| 7,506,768 B2 | 3/2009 | Rassmussen et al. | |
| 7,959,015 B2 | 6/2011 | Sempliner et al. | |
| 8,256,627 B2 | 9/2012 | Sempliner et al. | |
| 8,526,187 B2 | 9/2013 | Taylor | |
| 9,155,220 B2 * | 10/2015 | Yokosawa | H05K 7/183 |
| 9,578,785 B2 | 2/2017 | Drewery et al. | |
| 9,927,852 B2 | 3/2018 | Chia et al. | |
| 2002/0153338 A1 * | 10/2002 | Orr | A47B 47/03 |
| | | | 211/183 |
| 2009/0059486 A1 * | 3/2009 | Taylor | H05K 7/1488 |
| | | | 361/679.02 |

(Continued)

FOREIGN PATENT DOCUMENTS

AU    2016100276 A4    4/2016

*Primary Examiner* — Kimberley S Wright
(74) *Attorney, Agent, or Firm* — Dinsmore & Shohl, LLP

(57) ABSTRACT

Disclosed are systems and methods for providing a blanking panel. One embodiment includes a blanking panel for an information technology (IT) rack. The IT rack may have a width for receiving hardware into a rack space unit. The IT rack may have a plurality of vertical mounting beams that define the width. The blanking panel may include a cover that is sized and shaped to cover a front portion of the rack space unit on the IT rack and a plurality of rack connectors that connect the blanking panel to the plurality of vertical mounting beams. In some embodiments, the blanking panel includes a rotating pin, where at least one of the plurality of rack connectors is rotatably connected to permit rotation of the rotating pin around a second axis and where the rotating pin includes a pivot joint, to permit the rotating pin to rotate around a first axis.

20 Claims, 5 Drawing Sheets

(56) References Cited

U.S. PATENT DOCUMENTS

| | | | |
|---|---|---|---|
| 2009/0178985 A1* | 7/2009 | Sempliner | H05K 7/1461 |
| | | | 211/26 |
| 2010/0000953 A1* | 1/2010 | Shew | H05K 7/1401 |
| | | | 211/183 |
| 2012/0162904 A1* | 6/2012 | Chan | G06F 1/20 |
| | | | 361/679.48 |
| 2015/0060382 A1 | 3/2015 | Drewery et al. | |
| 2016/0205812 A1* | 7/2016 | Curtin | H05K 7/20736 |
| | | | 361/679.46 |

* cited by examiner

FLEXIBLE ROTATING BLANKING PANEL FOR AN IT RACK

TECHNICAL FIELD

Embodiments described herein generally relate to a blanking panel for an IT rack and, more specifically, to a flexible rotating blanking panel for an IT Rack.

BACKGROUND

In the information technology (IT) space, cloud computing has now become far more important than ever. As a result of this, server installations are not only more common, but constantly changing, resulting in increased utilization of computing hardware such as servers. Such hardware is typically installed inside IT racks that are usually housed in data centers. The IT racks may provide rack space units to host several servers. Normally, some of the rack space units are empty and these gaps may be closed on a front portion of the IT rack by blanking panels. The blanking panels may be configured as panels to fit into or adjacent a rack space unit that reduces or eliminates air mixing, as such cycling will not allow sufficient cooled air to be drawn by the hardware. The air circulation inside the IT rack can affect the operating environment of the IT rack and cause outages, as the hardware typically requires specific thermal cooling requirements to operate.

The IT rack distribution is based on cold and hot aisles where the IT racks receive the cold air from the front of the hardware, which removes the heat from the backside. The hardware may run in a conditioned environment to ensure proper function and avoid overheating that might result in hardware interruption.

Current solutions do not resolve the issue of losing blanking panels after a hardware installation and the installation of the blanking panels after decommission or replacement of the hardware with different unit sizes. Hence, there is a need in the art for a fixed flexible rotating blanking panel for an IT rack.

SUMMARY

Disclosed are systems and methods for providing a blanking panel. One embodiment includes a blanking panel for an information technology (IT) rack. The IT rack may have a width for receiving hardware into a rack space unit. The IT rack may have a plurality of vertical mounting beams that define the width. The blanking panel may include a cover that is sized and shaped to cover a front portion of the rack space unit on the IT rack and a plurality of rack connectors that connect the blanking panel to the plurality of vertical mounting beams. In some embodiments, the blanking panel includes a rotating pin, where at least one of the plurality of rack connectors is rotatably connected to permit rotation of the rotating pin around a second axis and where the rotating pin includes a pivot joint, to permit the rotating pin to rotate around a first axis.

In another embodiment, an information technology (IT) rack is provided. The IT rack may have a width for receiving hardware into a rack space unit. The IT rack may have a plurality of vertical mounting beams that define the width and a blanking panel. The blanking panel may include a cover that is sized and shaped to cover a front portion of the rack space unit when the blanking panel is installed on the IT rack and a plurality of rack connectors that connect the blanking panel to the plurality of vertical mounting beams. In some embodiments, the blanking panel includes a rotating pin that is coupled to the cover and removably coupled to the plurality of rack connectors. The rotating pin may extend between the plurality of vertical mounting beams, where at least one of the plurality of rack connectors is rotatably connected to permit rotation of the rotating pin around a second axis. In some embodiments, the rotating pin includes a pivot joint, where the pivot joint permits the rotating pin to rotate around a first axis.

In yet another embodiment, a blanking panel for an information technology (IT) rack is provided. The IT rack may have a width for receiving hardware into a rack space unit and a plurality of vertical mounting beams that define the width. The blanking panel may include a cover that is sized and shaped to cover a front portion of the rack space unit on the IT rack, a plurality of rack connectors that connect the blanking panel to the plurality of vertical mounting beams, and a rotating pin that is coupled to the cover and removably coupled to the plurality of rack connectors. In some embodiments, the rotating pin extends between the plurality of vertical mounting beams of the IT rack, where at least one of the plurality of rack connectors is rotatably connected to permit rotation of the rotating pin around a second axis. In some embodiments, the rotating pin includes a pivot joint, where the pivot joint permits the rotating pin to rotate around a first axis, and where the rotating pin further includes a sliding pin component for engaging the pivot joint.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein include systems and methods for providing blanking panels for an IT rack. Some embodiments of the blanking panels can rotate about 90 degrees horizontally and/or vertically to allow for hardware installation without removal of the blanking panel and to ensure permeant isolation of cold and hot air. These embodiments may result in a cost savings that is realized by eliminating the regular need of reordering new blanking panels because of loss; storage costs for unused blanking panels; and personnel costs associated with having to reinstall blanking panels after any decommission or deployment of different hardware unit size. The systems and methods for blanking panels for IT racks incorporating the same will be described in more detail, below.

Figure 1:
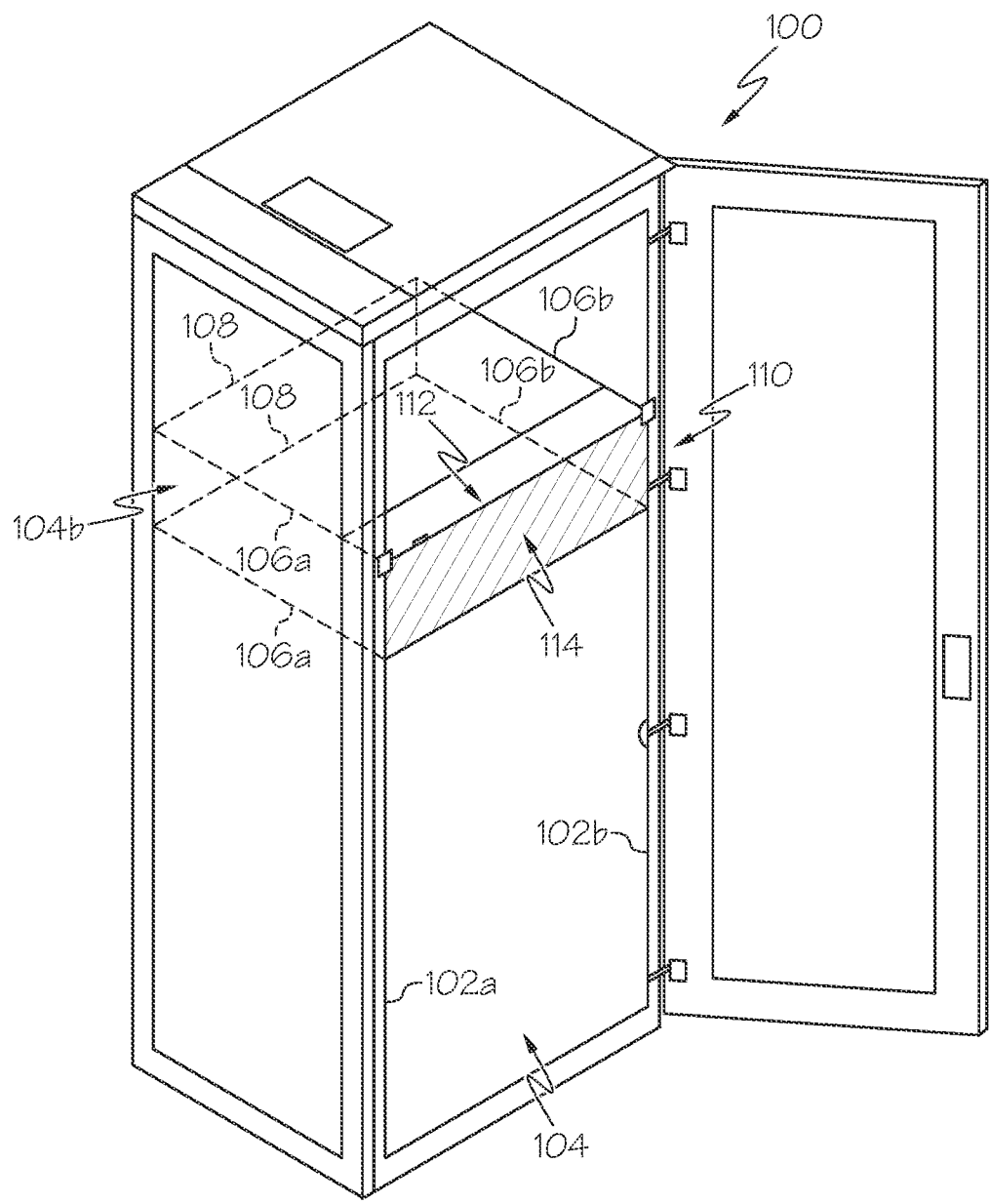
FIG. 1 depicts an IT rack for receiving hardware, according to embodiments described herein.

Referring now to the drawings, FIG. 1 depicts an IT rack 100 for receiving hardware, according to embodiments described herein. As illustrated, the IT rack 100 may be rectangular in shape and may include a plurality of vertical mounting beams 102a, 102b that define a width of the IT rack 100 and a frontal exterior perimeter of the IT rack 100 and in part define rack space 104a into which hardware may be inserted. As will be understood, the vertical mounting beams 102a, 102b may be configured with notches, apertures, and/or other features that are capable of receiving and securing hardware into the IT rack 100.

The features of the vertical mounting beams 102a, 102b may be configured such that lateral beams 106a, 106b may be coupled to the vertical mounting beams 102a, 102b to support the hardware within the IT rack 100. The height of each of the lateral beams 106a, 106b may depend on the height of the hardware being installed into the IT rack 100. As will be understood, a plurality of different pieces of hardware may be installed into the IT rack 100. As a result, the lateral beams 106a, 106b may define individual heights of rack space units 104b that may be similar and/or different from one another, depending on the hardware being received in those rack space units 104b. Rearward mounting beams 108 may be coupled to the lateral beams 106a, 106b for providing further support for the hardware and structure of the IT rack 100.

Also provided in FIG. 1 is a blanking panel 110. The blanking panel 110 may be configured to couple to the vertical mounting beams 102a, 102b via a rotating pin 112 and cover a rack space unit 104b that is not being occupied by hardware. As described in more detail below, the blanking panel 110 may include a cover 114 that covers the rack space unit 104b and reduces or prevents airflow out the front of the IT rack 100.

Figure 2A:
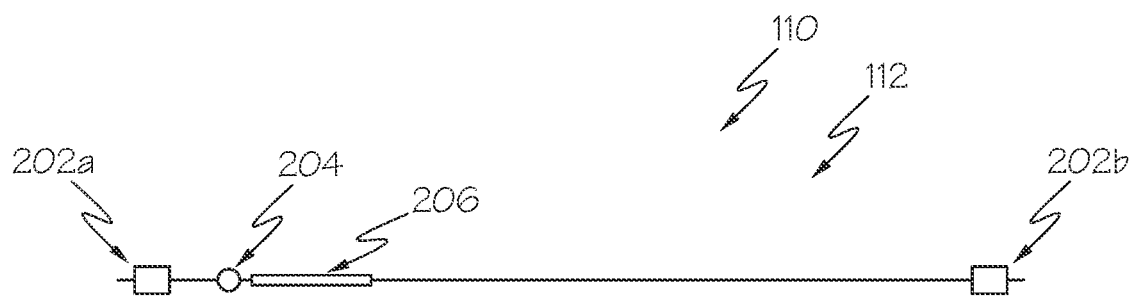
FIGS. 2A, 2B depict a rotating pin for a blanking panel, according to embodiments described herein.
Figure 2B:

FIGS. 2A, 2B depict a rotating pin 112 for a blanking panel 110, according to embodiments described herein. As illustrated, the blanking panel 110 may include the rotating pin 112, as well as a plurality of rack connectors, such as rack connectors 202a, 202b, a pivot joint 204, and a sliding pin component 206. As described in more detail below, the rack connectors 202a, 202b are configured to temporarily or permanently connect or affixed to the vertical mounting beams 102a, 102b on an IT rack 100 (FIG. 1). As an example, the rack connectors 202a, 202b may engage a notch or aperture of the vertical mounting beams 102a, 102b that secures the blanking panel 110 in a configuration that covers the rack space unit 104b.

As also illustrated, the pivot joint 204 may be configured as a bending point of the rotating pin 112. Specifically, hardware may vary in rack space unit 104b. Also, it may be difficult to insert or remove the blanking panel 110 into the rack space unit 104b (FIG. 1). This difficulty may result from other hardware being utilized in adjacent rack space units 104b, accessibility of the IT rack 100 (FIG. 1), and/or for other reasons. Regardless, the pivot joint 204 may allow the rotating pin 112 to bend, thereby enabling easier insertion or removal of the blanking panel 110. The pivot joint 204 may be coupled to the sliding pin component 206, which may be configured to slide inside the pivot joint 204 (FIG. 2B). When the sliding pin component 206 is pushed within the pivot joint 204 (FIG. 2B), the rigid structure of the sliding pin component 206 prevents the pivot joint 204 from bending. When the sliding pin component 206 is pushed outside the pivot joint 204 (FIG. 2A), the pivot joint 204 may be free to bend.

While more detail regarding the pivot joint 204 and the sliding pin component 206 is provided below, it will be understood the some embodiments of the sliding pin component 206 may be configured to reside around the pivot joint 204 to prevent bending. Other configurations for preventing the pivot joint 204 from bending are also provided.

Figure 3A:
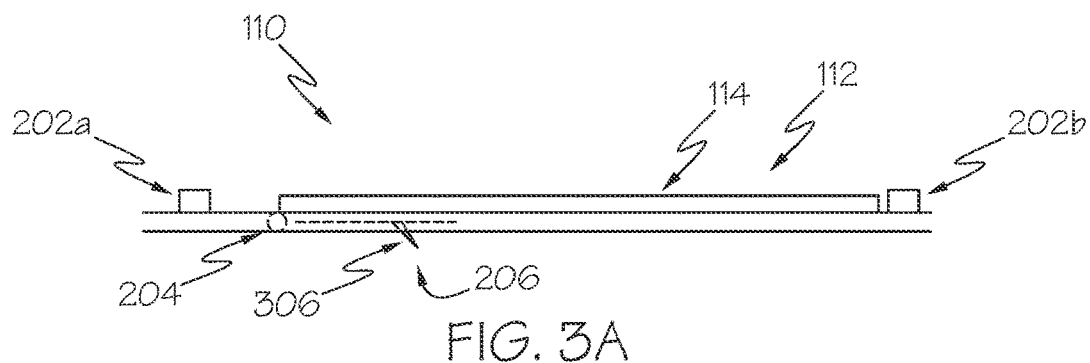
FIGS. 3A-3F depict various components of a blanking panel, according to embodiments described herein.
Figure 3B:
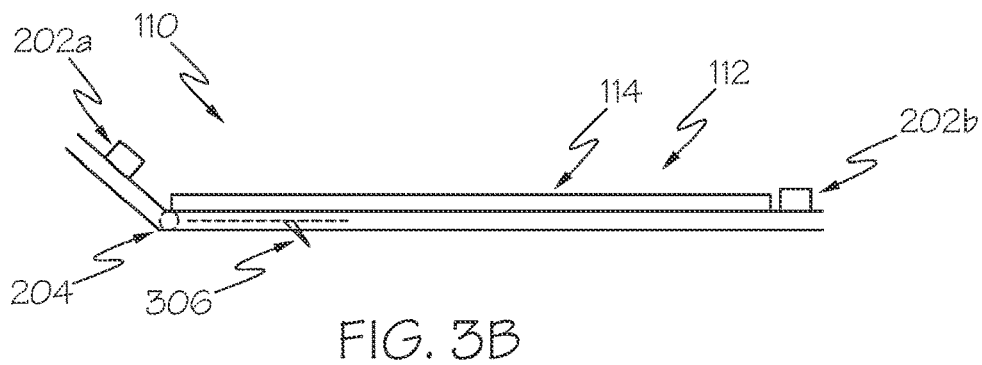

FIGS. 3A-3F depict various components of a blanking panel 110, according to embodiments described herein. As illustrated in FIG. 3A, the pivot joint 204 may be configured as a ball and socket joint, hinge, and/or other joint that allows at least 90 degrees of bend to the rotating pin 112 in one or more directions. As described above, the pivot joint 204 may be engaged by pushing the sliding pin component 206 toward (and thus inside or around) the pivot joint 204. FIG. 3A also depicts a lever 306 by which a user may engage or disengage the pivot joint 204 in this manner. FIG. 3B illustrates disengagement of the sliding pin component 206 with the pivot joint 204, thus allowing the rotating pin 112 to bend.

It will be recognized that FIGS. 3A, 3B depict an overhead perspective of the blanking panel 110. As illustrated, some embodiments may be configured such that the cover 114 and the rack connectors 202a, 202b are disposed on a similar side of the blanking panel 110. While this is not a requirement, these embodiments may provide for coupling the rack connectors 202a, 202b to a front surface of the vertical mounting beams 102a, 102b, with the cover 114 substantially aligning with an outer edge of the vertical mounting beams 102a, 102b.

Figure 3C:
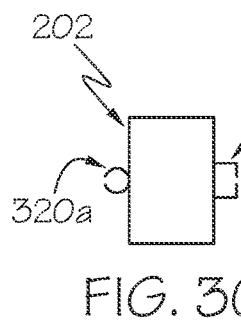
Figure 3D:
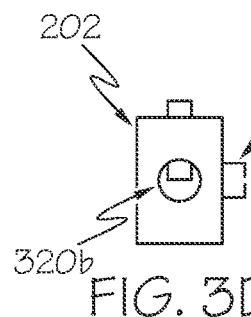
Figure 3E:
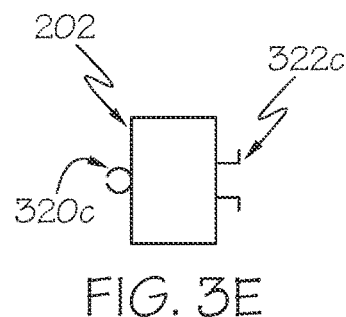

FIGS. 3C-3E depict close up perspectives of the rack connectors 202a, 202b (collectively referred to as rack connector 202). Specifically, the rack connector 202 in FIG. 3C may include a concave coupler 320a for receiving the rotating pin 112. The concave coupler 320a may be constructed of plastic, metal, or other material for rotatably securing the rotating pin 112. While in some embodiments, the connection between the rotating pin 112 and the concave coupler 320a may be removable, in some embodiments, the connection is permanent. As such, the concave coupler 320a may be configured as a circular connector, a rectangular connector, a tie, a weld, and/or other type of connection component that permits rotation of the rotating pin 112.

Also provided in FIG. 3C is a rack mounting coupler 322a. The rack mounting coupler 322a may be sized and shaped to wrap around a feature of the vertical mounting beams 102a, 102b. Specifically, the configuration of the rack mounting coupler 322a is configured to engage with a rectangular notch. As will be understood, the rack mounting coupler 322 may take different shapes and sizes (round, weld, tie, etc.) for temporarily or permanently mounting the blanking panel 110 to the IT rack 100.

As illustrated in FIG. 3D, the rack connector 202 may include an internal coupler 320b for receiving and rotatably securing the rotating pin 112. The internal coupler 320b may include a spring-loaded securing portion for securing the rotating pin 112 inside the rack connector 202. FIG. 3D also depicts a rack mounting coupler 322a similar to that from FIG. 3C.

FIG. 3E depicts a concave coupler 320a, similar to that from FIG. 3C.

Figure 3F:
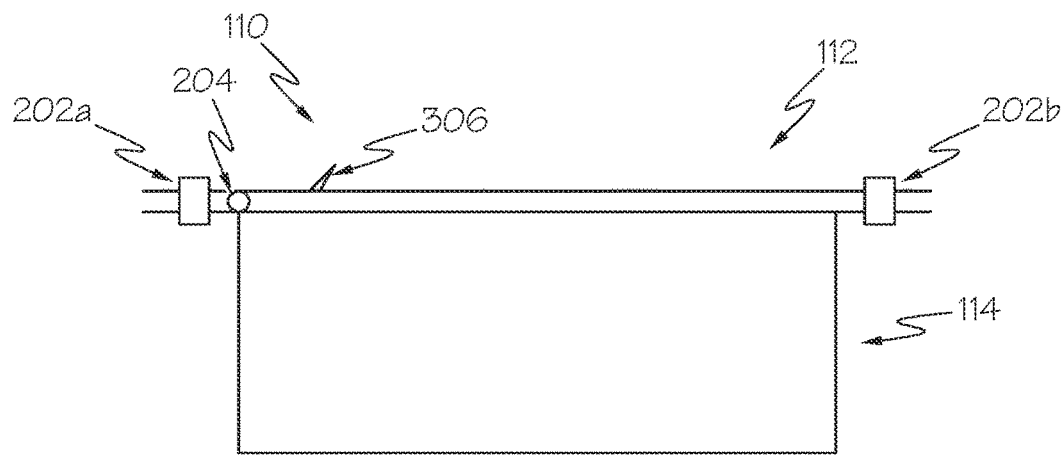

However, FIG. 3E provides an aperture coupler 322c. The aperture coupler 322c may be configured for engaging with a notch or aperture of the vertical mounting beams 102a, 102b. As will be understood, the size and shape of the aperture coupler 322c may vary, depending on the features of the vertical mounting beams 102a, 102b. FIG. 3F depicts a front view of the blanking panel 110, with the cover 114 rotated downward. As will be provided in FIGS. 4 and 5, the cover 114 may rotate around a plurality of different axes, depending on the usage.

Figure 4:
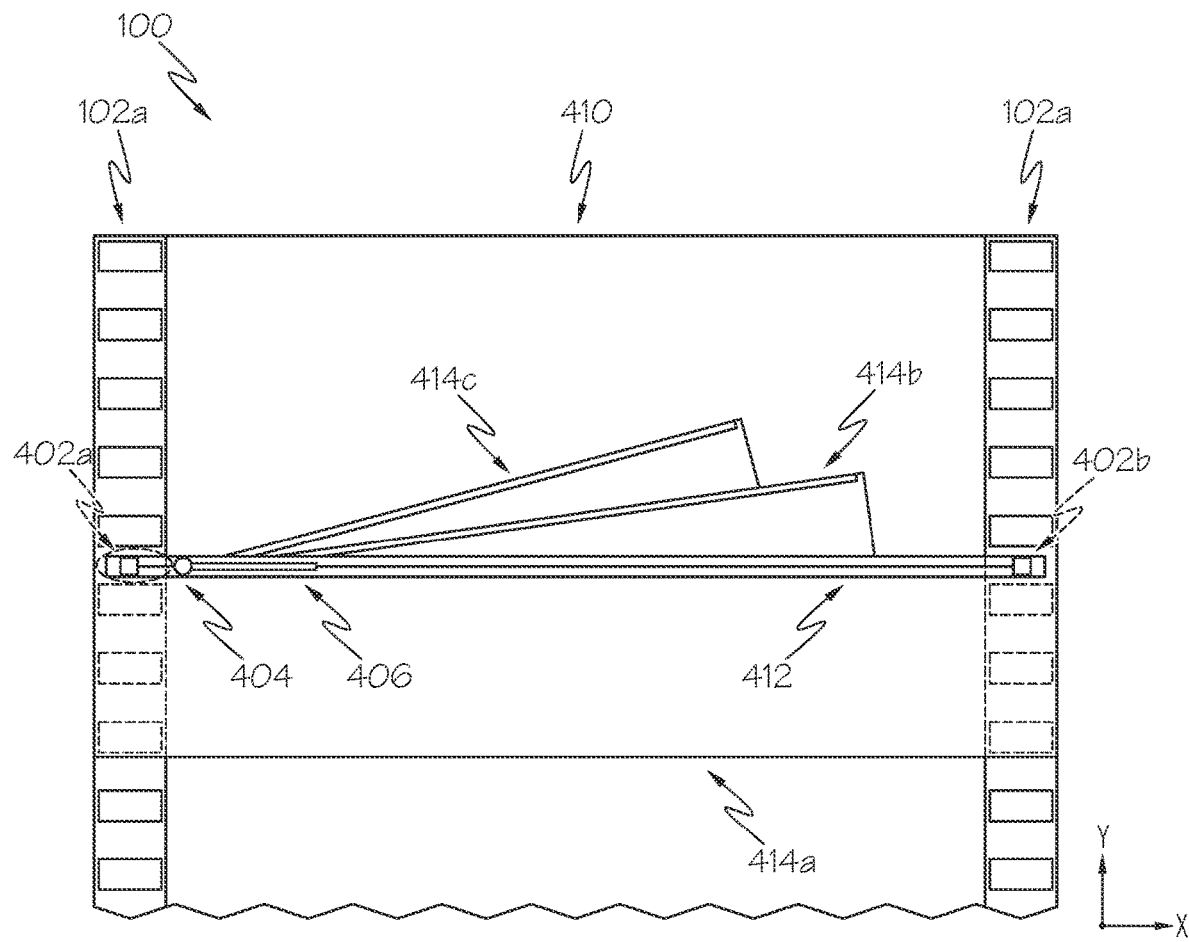
FIG. 4 depicts a blanking panel in an IT rack, illustrating rotation in a first direction, according to embodiments described herein.

FIG. 4 depicts a blanking panel 410 in an IT rack 100, illustrating rotation of the blanking panel 410 in a first direction, according to embodiments described herein. As illustrated, the blanking panel 410 may include a rotating pin 412 that is coupled to a cover 414a. The blanking panel 410 may be coupled to the vertical mounting beams 102a, 102b via rack connectors 402a, 402b, as described above. Similarly, the rotating pin 412 may be permitted to rotate by disengaging the sliding pin component 406, allowing the pivot joint 404 to rotate around the y-axis (e.g., a first axis), as illustrated via the various positions of the cover 414a (illustrated as covers 414b and 414c). As will be understood, the example of FIG. 4 allows rotation of the cover 414 into the IT rack 100. Thus, in this embodiment, the blanking panel 410 may be mounted to an interior surface of the vertical mounting beams 102a, 102b, thus allowing rotation in this first direction. Accordingly, while the embodiments of FIGS. 3A, 3B illustrate the rack connectors 202a, 202b on the same side of the blanking panel 110 as the cover 114, in FIG. 4, the rack connectors 402a, 402b may be on different sides, so long as the rotating pin 412 is disposed on an interior surface of the vertical mounting beams 102a, 102b to permit this rotation.

Figure 5:
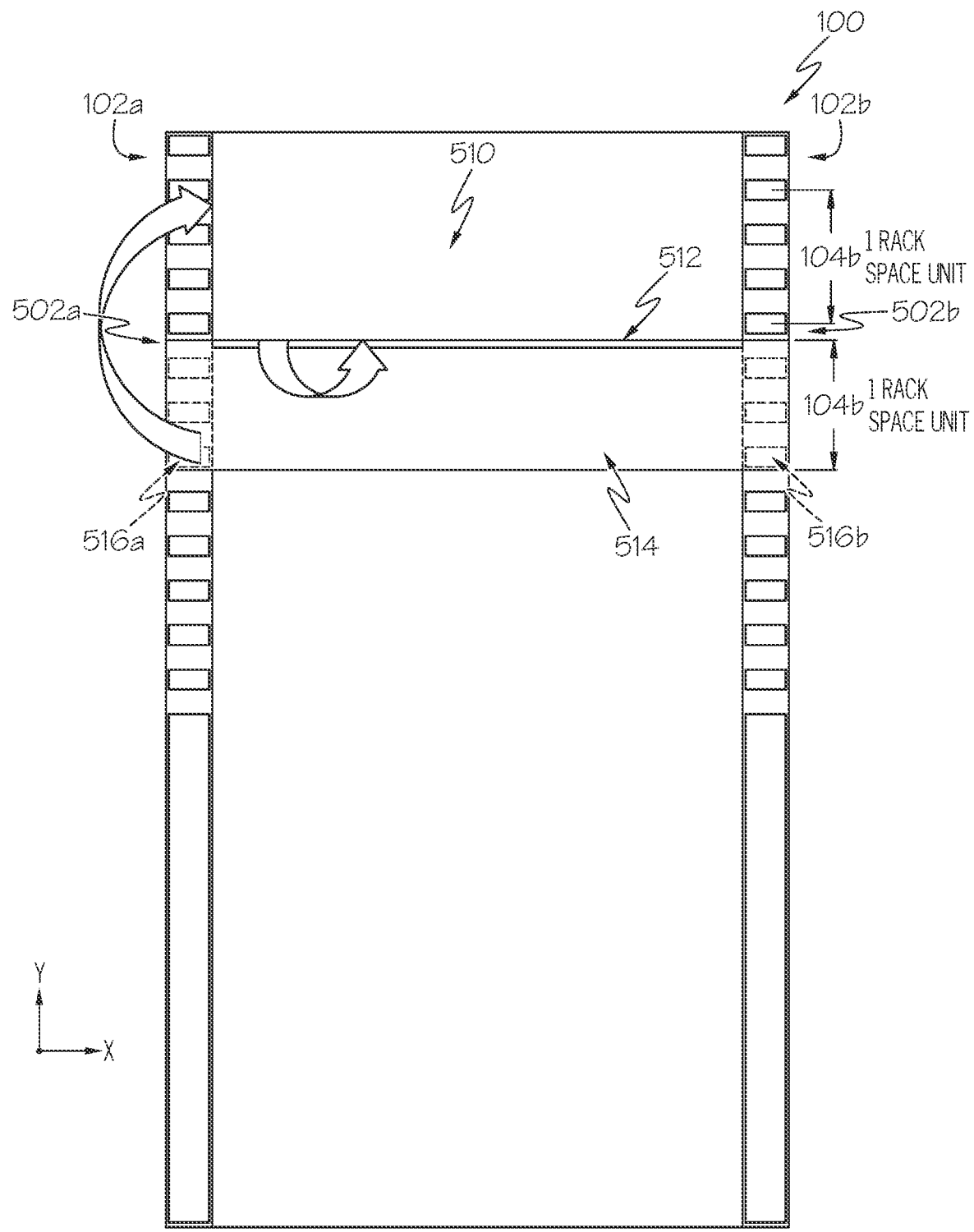
FIG. 5 depicts a blanking panel in an IT rack, illustrating rotation in a second direction, according to embodiments described herein.

FIG. 5 depicts a blanking panel 510 in an IT rack 100, illustrating rotation in a second direction, according to embodiments described herein. As illustrated, the blanking panel 510 may include a rotating pin 512 and a cover 514. As described above, the rotating pin 512 may be coupled to the vertical mounting beams 102a, 102b. Additionally, the rotating pin 512 may be rotatably secured to rack connectors 502a, 502b (such as via the concave coupler 320a FIG. 3C, the internal coupler 320b from FIG. D, and/or via other couplers). The rotatable coupling permits the rotating pin 512 to rotate around the x-axis (e.g., a second axis) in FIG. 5. This rotation opens the rack space unit 104b for installation of hardware therein. Thus, the hardware may be used to push the cover 514, thus causing the rotation of the rotating pin 512, when installing the hardware into the IT rack 100. When the hardware is removed, the rotating pin 512 may rotate back to the position depicted in FIG. 5 via gravity.

Also included in the example of FIG. 5 are a plurality of carton covers, such as carton covers 516a, 516b, which may be sized approximately similar in length to the cover 514 and thus the rack space unit 104b. The carton covers 516a, 516b may be installed over the vertical mounting beams 102a, 102b to cover the rack connectors 502a, 502b. The carton covers 516a, 516b may be secured to the vertical mounting beams 102a, 102b via similar couplers as depicted in FIGS. 3C-3E and/or via glue, weld, tape, etc.

As illustrated above, various embodiments for a replaceable blanking panel for an IT rack are disclosed. These embodiments may reduce the cost and expense of losing blanking panels, provide the ability to easily retrofit current IT racks with new replaceable panels, as well as provide a secure fit for different sized rack space units.

One or more aspects of the present disclosure are described herein. A first aspect of the present disclosure may include a blanking panel for an information technology (IT) rack, the IT rack having a width for receiving hardware into a rack space unit, the IT rack having a plurality of vertical mounting beams that define the width, the blanking panel comprising: a cover that is sized and shaped to cover a front portion of the rack space unit on the IT rack; a plurality of rack connectors that connect the blanking panel to the plurality of vertical mounting beams; and a rotating pin that is coupled to the cover and removably coupled to the plurality of rack connectors, wherein the rotating pin extends across between the plurality of vertical mounting beams, wherein at least one of the plurality of rack connectors is rotatably connected to permit rotation of the rotating pin around a second axis, wherein the rotating pin includes a pivot joint, wherein the pivot joint permits the rotating pin to rotate around a first axis.

A second aspect of the present disclosure includes the blanking panel of the first aspect, wherein the rotating pin further comprises a sliding pin component that slides into contact with the pivot joint to disengage the pivot joint and slides out of contact with the pivot joint to engage the pivot joint.

A third aspect of the present disclosure includes the blanking panel of the first and/or second aspect, wherein the sliding pin component is disposed according to at least one of the following: within the rotating pin or outside of the rotating pin.

A fourth aspect of the present disclosure includes the blanking panel of any of the previous aspects, wherein the sliding pin component includes a lever for engaging and disengaging the sliding pin.

A fifth aspect of the present disclosure includes the blanking panel of any of the previous aspects, wherein the blanking panel is permanently affixed to the IT rack.

A sixth aspect of the present disclosure includes the blanking panel of any of the previous aspects, further comprising a plurality of carton covers that secure the plurality of vertical mounting beams.

A seventh aspect of the present disclosure includes the blanking panel of any of the previous aspects, wherein the plurality of rack connectors includes at least one of the following for rotatably connecting to the rotating pin: a concave coupler or an internal coupler.

An eighth aspect of the present disclosure includes a system that includes an information technology (IT) rack, the IT rack having a width for receiving hardware into a rack space unit, the IT rack having a plurality of vertical mounting beams that define the width; and a blanking panel comprising: a cover that is sized and shaped to cover a front portion of the rack space unit when the blanking panel is installed on the IT rack; a plurality of rack connectors that connect the blanking panel to the plurality of vertical mounting beams; and a rotating pin that is coupled to the cover and removably coupled to the plurality of rack connectors, wherein the rotating pin extends between the plurality of vertical mounting beams, wherein at least one of the plurality of rack connectors is rotatably connected to permit rotation of the rotating pin around a second axis, wherein the rotating pin includes a pivot joint, wherein the pivot joint permits the rotating pin to rotate around a first axis.

A ninth aspect of the present disclosure includes the blanking panel of any of the eighth aspect, wherein the rotating pin further comprises a sliding pin component that slides into contact with the pivot joint to disengage the pivot joint and slides out of contact with the pivot joint to engage the pivot joint.

A tenth aspect of the present disclosure includes the blanking panel of eighth and/or ninth aspects, wherein the sliding pin component is disposed according to at least one of the following: within the rotating pin or outside of the rotating pin.

An eleventh aspect of the present disclosure includes the blanking panel of any of the previous aspects, wherein the sliding pin component includes a lever for engaging and disengaging the sliding pin.

An twelfth aspect of the present disclosure includes the blanking panel of any of the previous aspects, wherein the blanking panel is permanently affixed to the IT rack.

A thirteenth aspect of the present disclosure includes the blanking panel of any of the previous aspects, further comprising a plurality of carton covers that secure the plurality of vertical mounting beams.

A fourteenth aspect of the present disclosure includes the blanking panel of any of the previous aspects, wherein the plurality of rack connectors include at least one of the following for rotatably connecting to the rotating pin: a concave coupler or an internal coupler.

A fifteenth aspect of the present disclosure includes a blanking panel for an information technology (IT) rack, the IT rack having a width for receiving hardware into a rack space unit, the IT rack having a plurality of vertical mounting beams that define the width, the blanking panel comprising: a cover that is sized and shaped to cover a front portion of the rack space unit on the IT rack; a plurality of rack connectors that connect the blanking panel to the plurality of vertical mounting beams; and a rotating pin that is coupled to the cover and removably coupled to the plurality of rack connectors, wherein the rotating pin extends between the plurality of vertical mounting beams of the IT rack, wherein at least one of the plurality of rack connectors is rotatably connected to permit rotation of the rotating pin around a second axis, wherein the rotating pin includes a pivot joint, wherein the pivot joint permits the rotating pin to rotate around a first axis, wherein the rotating pin further includes a sliding pin component for engaging the pivot joint.

A sixteenth aspect of the present disclosure includes the blanking panel of the fifteenth aspect, wherein the sliding pin component slides into contact with the pivot joint to disengage the pivot joint and slides out of contact with the pivot joint to engage the pivot joint.

A seventeenth aspect of the present disclosure includes the blanking panel of the fifteenth and/or sixteenth aspects, wherein the sliding pin component is disposed according to at least one of the following: within the rotating pin or outside of the rotating pin.

An eighteenth aspect of the present disclosure includes the blanking panel of any of the previous aspects, wherein the blanking panel is permanently affixed to the IT rack.

A nineteenth aspect of the present disclosure includes the blanking panel of any of the previous aspects, wherein the sliding pin component includes a lever for engaging and disengaging the sliding pin.

A twentieth aspect of the present disclosure includes the blanking panel of any of the previous aspects, wherein the plurality of rack connectors include at least one of the following for rotatably connecting to the rotating pin: a concave coupler or an internal coupler.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein. It should also be understood that these embodiments are merely exemplary and are not intended to limit the scope of this disclosure.

The following is claimed:

1. A blanking panel for an information technology (IT) rack, the IT rack having a width for receiving hardware into a rack space unit, the IT rack having a plurality of vertical mounting beams that define the width, the blanking panel comprising:
   a cover that is sized and shaped to cover a front portion of the rack space unit on the IT rack;
   a plurality of rack connectors that connect the blanking panel to the plurality of vertical mounting beams; and
   a rotating pin that is coupled to the cover and removably coupled to the plurality of rack connectors, wherein the rotating pin extends across between the plurality of vertical mounting beams, wherein at least one of the plurality of rack connectors is rotatably connected to permit rotation of the rotating pin around a second axis, wherein the rotating pin includes a pivot joint, wherein the pivot joint permits the rotating pin to rotate around a first axis.

2. The blanking panel of claim 1, wherein the rotating pin further comprises a sliding pin component that slides into contact with the pivot joint to disengage the pivot joint and slides out of contact with the pivot joint to engage the pivot joint.

3. The blanking panel of claim 2, wherein the sliding pin component is disposed according to at least one of the following: within the rotating pin or outside of the rotating pin.

4. The blanking panel of claim 2, wherein the sliding pin component includes a lever for engaging and disengaging the sliding pin.

5. The blanking panel of claim 1, wherein the blanking panel is permanently affixed to the IT rack.

6. The blanking panel of claim 1, further comprising a plurality of carton covers that secure the plurality of vertical mounting beams.

7. The blanking panel of claim 1, wherein the plurality of rack connectors includes at least one of the following for rotatably connecting to the rotating pin: a concave coupler or an internal coupler.

8. A system comprising:
   an information technology (IT) rack, the IT rack having a width for receiving hardware into a rack space unit, the IT rack having a plurality of vertical mounting beams that define the width; and
   a blanking panel comprising:
      a cover that is sized and shaped to cover a front portion of the rack space unit when the blanking panel is installed on the IT rack;
      a plurality of rack connectors that connect the blanking panel to the plurality of vertical mounting beams; and
      a rotating pin that is coupled to the cover and removably coupled to the plurality of rack connectors, wherein the rotating pin extends between the plurality of vertical mounting beams, wherein at least one of the plurality of rack connectors is rotatably connected to permit rotation of the rotating pin around a second axis, wherein the rotating pin includes a pivot joint, wherein the pivot joint permits the rotating pin to rotate around a first axis.

9. The system of claim 8, wherein the rotating pin further comprises a sliding pin component that slides into contact with the pivot joint to disengage the pivot joint and slides out of contact with the pivot joint to engage the pivot joint.

10. The system of claim 9, wherein the sliding pin component is disposed according to at least one of the following: within the rotating pin or outside of the rotating pin.

11. The system of claim 9, wherein the sliding pin component includes a lever for engaging and disengaging the sliding pin.

12. The system of claim 8, wherein the blanking panel is permanently affixed to the IT rack.

13. The system of claim 8, further comprising a plurality of carton covers that secure the plurality of vertical mounting beams.

14. The system of claim 8, wherein the plurality of rack connectors include at least one of the following for rotatably connecting to the rotating pin: a concave coupler or an internal coupler.

15. A blanking panel for an information technology (IT) rack, the IT rack having a width for receiving hardware into a rack space unit, the IT rack having a plurality of vertical mounting beams that define the width, the blanking panel comprising:
    a cover that is sized and shaped to cover a front portion of the rack space unit on the IT rack;
    a plurality of rack connectors that connect the blanking panel to the plurality of vertical mounting beams; and
    a rotating pin that is coupled to the cover and removably coupled to the plurality of rack connectors, wherein the rotating pin extends between the plurality of vertical mounting beams of the IT rack, wherein at least one of the plurality of rack connectors is rotatably connected to permit rotation of the rotating pin around a second axis, wherein the rotating pin includes a pivot joint, wherein the pivot joint permits the rotating pin to rotate around a first axis, wherein the rotating pin further includes a sliding pin component for engaging the pivot joint.

16. The blanking panel of claim 15, wherein the sliding pin component slides into contact with the pivot joint to disengage the pivot joint and slides out of contact with the pivot joint to engage the pivot joint.

17. The blanking panel of claim 16, wherein the sliding pin component is disposed according to at least one of the following: within the rotating pin or outside of the rotating pin.

18. The blanking panel of claim 15, wherein the blanking panel is permanently affixed to the IT rack.

19. The blanking panel of claim 15, wherein the sliding pin component includes a lever for engaging and disengaging the sliding pin.

20. The blanking panel of claim 15, wherein the plurality of rack connectors include at least one of the following for rotatably connecting to the rotating pin: a concave coupler or an internal coupler.

* * * * *